United States Patent [19]

Hirooka

[11] Patent Number: 4,554,180
[45] Date of Patent: Nov. 19, 1985

[54] PROCESS FOR PRODUCING SILICON-CONTAINING DEPOSIT FILM

[75] Inventor: Masaaki Hirooka, Toride, Japan
[73] Assignee: Canon Kabushiki Kaisha, Tokyo, Japan
[21] Appl. No.: 628,569
[22] Filed: Jul. 6, 1984
[30] Foreign Application Priority Data
Jul. 22, 1983 [JP] Japan .............................. 58-1341622
[51] Int. Cl.⁴ ...................... C23C 11/00; C23C 13/00
[52] U.S. Cl. ................................. 427/248.1; 427/86; 427/255.1
[58] Field of Search .................. 427/248.1, 255.1, 255, 427/86

[56] References Cited

U.S. PATENT DOCUMENTS 4,027,053  5/1977  Lesk ..................................... 427/255
4,363,828 12/1982  Brodsky et al. ....................... 427/39
4,495,218  1/1985  Azuma et al. ......................... 427/86

OTHER PUBLICATIONS

Scott et al, "Kinetics & Mechanism of Amorphous Hydrogenated Silicon Growth by Homogeneous Chemical Vapor Deposition", Appl. Phys. Lett., vol. 39, No. 1, pp. 73–75, Jul. 1, 1981.

*Primary Examiner*—Sadie L. Childs
*Attorney, Agent, or Firm*—Fitzpatrick, Cella, Harper & Scinto

[57] ABSTRACT

A process for producing silicon-containing deposit films which comprises introducing a cyclic silane represented by the general formula $(SiH_2)_n$, wherein n is 4, 5, or 6, in the gaseous state together with a carrier gas into a deposition chamber and applying heat to the introduced gases at ordinary pressure to decompose the cyclic silane and form a silicon-containing deposit film on a substrate placed in the deposition chamber.

3 Claims, 1 Drawing Figure

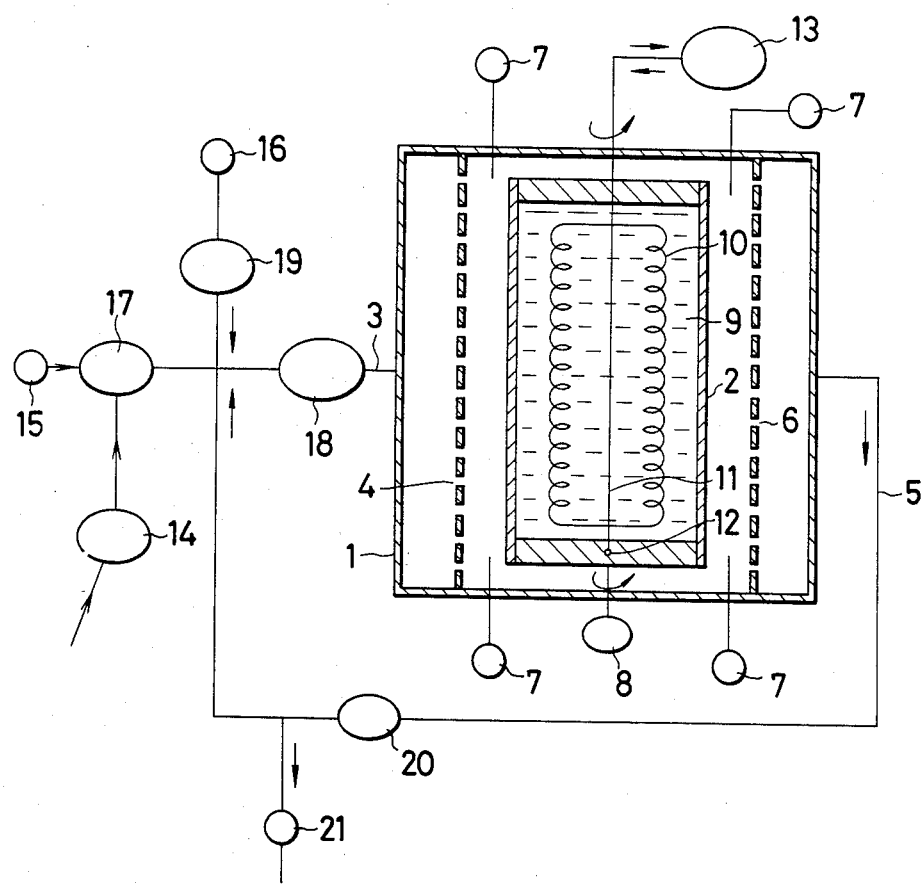

PROCESS FOR PRODUCING SILICON-CONTAINING DEPOSIT FILM

BACKGROUND OF THE INVENTION

1. Field of the Invention

The present invention relates to a process for producing a photoconductive, semiconductive, or insulating silicon-containing deposit film on a given substrate under ordinary pressure by utilizing thermal energy. More specifically, the invention relates to a process for producing a deposit film of silicon, particularly amorphous silicon (hereinafter designated as a-Si), on a given substrate under ordinary pressure through thermal decomposition of a gas containing mainly of a cyclic silane.

2. Description of the Prior Art

It is generally known that $SiH_4$ is decomposed with exciting energy such as electric discharge energy or thermal energy to form a-Si deposit films on substrates, and that the products are utilized for various purposes.

However, this process for producing a-Si deposit films from $SiH_4$ involves the following drawbacks:

(1) The film forming speed needs to be lowered for securing good product quality.

(2) Heating at a high temperature of 500°–600° C. is necessary to decompose $SiH_4$. This matter restricts the choice of substrates and other production conditions.

(3) For producing large area, thick deposit films, there are difficulties in securing the electrical and optical uniformity of the product and the constancy of product quality, and irregularities on the surface of the deposit film and defects in the interior thereof are liable to result.

(4) Because of the high temperature of film formation, little hydrogen atoms, which play a role important to the a-Si film quality, are incorporated into the film and a high density of localization levels results. This matter exerts undesirable effects on film properties suitable for semiconductor use.

Recently a process for producing a-Si deposit films from $Si_2H_6$ has been proposed to offset the above-mentioned drawbacks. This process, though drawing attention, is still unsatisfactory particularly in that a high temperature of at least 400° C. is necessary to utilize thermal energy for the decomposition of $Si_2H_6$. The reduction of energy consumption or improvement of productivity in this process is the problem to be solved in the future. While $Si_2H_6$ readily decomposes to $SiH_4$ and excited fragments and therefore is used more advantageously than $SiH_4$, the main decomposition product $SiH_4$ needs to be decomposed successively in order to utilize $Si_2H_6$ effectively. Accordingly, striking improvement in the efficiency of $Si_2H_6$ decomposition can be scarcely expected.

In addition, $Si_2H_6$ is expensive since it is not a generally available material and its production process has not been established. In consequence, the commercialization of the $Si_2H_6$-employing process is economically difficult unless effective formation of the deposit film is achieved.

U.S. Pat. No. 4,363,828 describes the possibility of utilizing higher silanes than $Si_2H_6$ but none of embodiments referring to cyclic silanes and measures of solving the above noted problems. Additionally, it has not been reported that such a higher silane could be produced in high yields or a deposit film therefrom was used as a valuable product. For industrializing the production of deposit films from a higher silane, many subjects remain in respect to the development of techniques for producing and utilizing the higher silane.

If the production of a-Si deposit films at a low energy level becomes feasible, the product films are expected to have high quality with uniformity, the control of production conditions will be facilitated, and the industrial productivity as well as the reproducibility will be improved.

The prior art production of a-Si deposit films is also carried out under reduced pressure in most cases. This is accompanied by the rise in costs of equipment and costs for maintaining and supervising equipment. Hence, improvements in this respect are desired now from the economical and technical points of view.

In the prior art process for producing a-Si deposit films, electric discharge energy is generally used to form the films. This inevitably leads to high costs of equipment, particularly of the reactor, and necessitates the exercise of great care on the control of production conditions so as to secure the uniformity, constancy, and reproducibility of product quality for the formation of large area, thick deposit films. Thus, there are various industrial problems in the present state of the art.

Also in the deposition process employing thermal energy for the decomposition, a high temperature of at least 600° C. is necessary though this depends upon the kind of gas used. Such a high temperature restricts substrates usable for the deposition and tends to eliminate important hydrogen atoms bound to the intended a-Si, so that desirable characteristics of products are difficult to obtain. Additionally the high temperature process is unsuited for mass production because of the low decomposition efficiency and deposition rate.

SUMMARY OF THE INVENTION

In view of above, the invention has been made to provide a novel process for producing silicon deposit films which solves the above stated problems.

Accordingly, an object of the invention is to provide a process for producing silicon-containing deposit films which permits a higher speed formation of the film while securing high quality thereof.

Another object of the invention is to provide a process for producing silicon-containing deposit films which permits the film formation at a lower temperature of the decomposition and under ordinary pressure by using not electric discharge energy but thermal energy for the decomposition.

A further object of the invention is to provide a process for producing silicon-containing deposit films, which gives the film of high quality ensuring the uniformity of electrical and optical characteristics and the constancy of quality even when the area and thickness of the film are large.

According to the present invention, there is provided a process for producing silicon-containing deposit films, which comprises introducing a cyclic silane represented by the general formula $(SiH_2)_n$, wherein n is 4, 5, or 6, in the gaseous state together with a carrier gas into a deposition chamber and applying heat to the introduced gases at ordinary pressure to decompose the cyclic silane and deposit a silicon-containing film on a substrate placed in the deposition chamber.

BRIEF DESCRIPTION OF THE DRAWING

The drawing is a schematic diagram of an apparatus for the formation, according to the invention, of photoconductive films around aluminum cylinders to produce photosensitive drums.

DETAILED DESCRIPTION OF PREFERRED EMBODIMENTS

Referring now to the drawing, the invention is described in detail. The drawing illustrates an embodiment of the formation of photoconductive silicon films around cylindrical substrates of aluminum or some other material, to produce photosensitive drums. However, the process of this invention is not limited to this embodiment but generally applicable to the formation of deposit films on substrates for producing, for example, semiconductor devices.

In the drawing, numeral 1 denotes a deposition chamber and numeral 2 denotes a substrate (e.g. aluminum cylinder) on which a deposition film is formed in the chamber. A gas inlet pipe 3 is connected to the deposition chamber 1, for introducing a raw material gas together with a carrier gas and, if necessary, with another suitable gas. The gas introduced through the inlet pipe 3 is blown into an inner deposition chamber through small holes penetrating a wall 4 which partitions the deposition chamber 1. Also a gas outlet pipe 5 is connected to the deposition chamber 1. The gas in the inner deposition chamber is discharged through small holes penetrating a wall 6 which partitions the deposition chamber 1 and through the outlet pipe 5. The deposition chamber 1 is equipped with a plurality of pressure sensors 7 for detecting pressures therein. The substrate 2 is designed to be rotatable around vertical axis thereof in the deposition chamber 1 by a motor 8. A heat transfer medium 9 is supplied into the substrate 2 so as to heat it and a heater 10 is immersed in the heat transfer medium 9 so as to heat and stir it. In the drawing, numerals 11 and 12 denote an inlet pipe and inlet port, respectively, for the heat transfer medium 9. A circulating thermostat 13 serves to circulate the heat transfer medium 9 into the substrate 2 and keep the medium therein at a constant temperature.

To the gas inlet pipe 3 are connected a raw material gas-regulating chamber 14 for supplying a gaseous cyclic silane represented by the general formula $(SiH_2)_n$ (n=4, 5, or 6), a carrier gas source 15 for supplying an inert carrier gas, and another gas source 16 for supplying, if necessary, other suitable gas. In the lines for supplying these gases, there are disposed preheating chambers 17, 18, and 19. To the gas outlet pipe 5 is connected a circulating pump 20 which recycles the exhaust to the deposition chamber 1 through the gas inlet pipe 3 or discharges the exhaust out of the system through a cock 21.

With the apparatus shown in the drawing, a silicon deposit film is formed in the following manner: The prescribed substrate 2, e.g. an aluminum cylinder, is set in the deposition chamber 1, heated and kept at a predetermined temperature with the heat transfer medium 9, and rotated around its own vertical axis by the motor 8. The above-mentioned gaseous cyclic silane from the raw material gas regulating chamber 14 together with the carrier gas from the carrier gas source 15 is passed through the preheating chambers 17 and 18 and through the gas inlet pipe 3 to be charged into the deposition chamber 1 where the charged gas is kept at ordinary or slightly elevated pressure. If necessary, another suitable gas is charged from the gas source 16 into the deposition chamber 1 by mixing with the raw material gas and the carrier gas. The other gas, which is mixed in a mass flow meter, is a gas containing suitable elements such as oxygen, nitrogen, carbon, and boron. The raw material gas charged into the deposition chamber 1 is decomposed by heating, forming a photoconductive a-Si film on the substrate 2.

The cyclic silanes used in the process of this invention are limited to those of $(SiH_2)_{4\sim 6}$. It is presumed that higher cyclic silanes than $(SiH_2)_6$ are readily decomposed with exciting energy at low temperatures to form the desired deposit film. However, it has been found that, contrary to the presumption, the decomposition behavior is unsteady, the decomposition is therefore difficult to control, the resulting films are inferior in the constancy of quality for photoconductor or semiconductor applications, many irregularities on the surface and defects in the inner part of the resulting films are present, and the films are non-uniform. Accordingly, the production of silicon deposit films from these higher cyclic silanes involves difficulties in the control of production conditions.

In contrast to this, cyclic silanes of $(SiH_2)_{4\sim 6}$ fit the objects of this invention. These cyclic silanes are best suited for the formation of silicon-containing deposit films. In particular, $(SiH_2)_5$ is the best in view of the yield of product and the ease of handling. $(SiH_2)_3$, although conceivable as the raw material, is unstable, difficult to isolate with the present techniques.

Cyclic silanes of $(SiH_2)_{4\sim 6}$, used in the invention, are readily decomposed with thermal exciting energy, and deposit films can be formed therefrom with low intensity of energy. Conceivably, this is because these cyclic silanes are more liable, on scission of Si—Si bonds constructing the cyclic molecules thereof, to yield hydrogen-deficient radicals or ions such as $SiH_2$, SiH, and Si than other silanes. This contributes to the remarkable increase in decomposition efficiency and to the improvements of deposition efficiency and rate.

According to the process of the invention wherein the thermal decomposition is utilized, silicon deposit films can be formed efficiently at temperatures of 100°–350° C., though the operational temperature slightly depends upon the apparatus used.

Also it has been revealed that silicon deposit films having entirely uniform properties can be formed from cyclic silanes of $(SiH_2)_{4\sim 6}$ without yielding, of course, any of local irregularities on the surface and defects in the interior of films in the stage of film growth, even when the films have large area and thickness.

Cyclic silanes of $(SiH_2)_{4\sim 6}$, used in the process of the invention, can be prepared, for instance, by treating a compound represented by the formula $RR'SiX_2$, with an alkali metal to give a cyclic compound of $(SiRR')_n$ ($n \geq 4$), reacting it with halogen or hydrogen halide to give $(SiX_2)_n$ ($n \geq 4$), and reducing it; wherein R and R' are the same or different and represent each hydrogen, lower alkyl; or substituted or unsubstituted phenyl or naphthyl and X represents halogen or alkoxy. Cyclic silanes of $(SiH_2)_{4\sim 6}$ prepared according to this process are particularly suited for use in the process of the invention.

Organosilicon halides of $RR'SiX_2$ suitable as raw materials for the cyclic silanes used in the invention include, for example, $(C_6H_5)_2SiCl_2$, $(CH_3)_2SiCl_2$, $(CH_3)_2SiBr_2$, $(C_6H_5)_2SiBr_2$, and $(C_6H_5)_2SiI_2$, which are common industrial chemicals, and further derivatives such as $(C_6H_4Cl)_2SiCl_2$, $(C_{10}H_7)SiHCl_2$, and $(C_{10}H_7)_2SiCl_2$. When both R and R' are hydrogen, cyclic silanes can be obtained without the dealkylation, dephenylation, or reduction, but the yield is somewhat low.

When the above defined $RR'SiX_2$ is added to a dispersion of powdery alkali metal, e.g. Li, Na, or K, in an organic solvent, e.g. tetrahydrofuran, and the mixture is stirred, a cyclic compound mixture containing mainly $(SiRR')_{4\sim6}$ (n=5 cyclic silane content $\geq 70\%$) is obtained. In this case, a powdery alkali metal such as Li is used in an amount of 1.5-3 moles, preferably 2-2.5 moles, per mole of $RR'SiX_2$. This reaction, since exothermic, is desirably carried out at room temperature (10°-30° C.) under suitable cooling. The resulting product is purified by usual methods such as recrystallization and washing.

The thus obtained cyclic organosilane compound $(SiRR')_n$ ($n \geq 4$) is halogenated with halogen or hydrogen halide without scission of the Si—Si bond. This halogenation is carried out in the way of contacting the cyclic organosilane with a liquid halogen or hydrogen halide under pressure or in the way of reacting in the presence of an aluminum halide in an organic solvent, e.g. benzene. Halogen or hydrogen halide is used in an amount of at least 2n moles, usually 2.5-3.5 n moles, per mole of $(SiRR')_n$. The halogenation is continued at room temperature for about 1-4 days. The reaction product should be handled in a closed chamber or dry box because of the liability to be hydrolyzed with water or moist air. The product is purified by removing solvent and by-products in ordinary ways including recrystallization, washing, and distillation.

The thus obtained halogenated cyclic silane is hydrogenated with a reducing agent such as $LiAlH_4$ in ether to give the cyclic silane of $(SiH_2)_n$ ($n \geq 4$). The product purified by distillation is stored in a sealed container such as a bomb. Similarly to the cases of unstable inflamable compounds $SiH_4$, $Si_2H_6$, and the like, these operations should be conducted in closed systems such as a vacuum chamber and dry box.

The process for the preparation of cyclic silanes used in the invention is illustrated by the following preparation examples: All "parts" therein are by weight.

Preparation Example 1

In a four-necked flask equipped with a thermometer, condenser, stirrer, and dropping funnel, there were placed 21 parts of metallic Li powder and 350 parts of tetrahydrofuran (THF). Then a solution of 300 parts of diphenyldichlorosilane in 350 parts of dry purified THF was added dropwise with stirring. Since the reaction is exothermic, the reaction temperature was kept at room temperature by cooling the reaction mixture suitably and controlling the rate of the dropping. After completion of the dropping, stirring was continued for 24 hours. The reaction mixture was then filtered to remove LiCl and other insoluble by-products (hereinafter designated as X). THF was removed by distillation from the filtrate, 500 parts of benzene was added to the residue, the resulting mixture was filtered again, benzen was removed by distillation from the filtrate, and the residue was purified by recrystallization from ethyl acetate, giving $[Si(C_6H_5)_2]_5$ (hereinafter designated as A), yield 65%.

Then, 911 parts of A was placed in an autoclave, which was connected to a vacuum line, and 1600 parts of dry purified liquid HBr was introduced into the autoclave to initiate the dephenylation-bromination of A under pressurized and closed conditions. The reaction proceeded almost quantitatively under mild shaking at room temperature. The resulting benzene and remaining volatile matter were removed from the reaction mixture, giving 950 parts of crystalline $(SiBr_2)_5$ (hereinafter designated as B).

A dispersion of 200 parts of $LiAlH_4$, as a reducing agent, in 1000 parts of diethyl ether was placed in a five-necked, air-tight flask equipped with a thermometer, condenser, stirrer, dropping funnel, and inert gas inlet tube. Then 1000 parts of a diethyl ether solution containing about 15 wt % of B was added dropwise to reduce B. The reaction was continued for 3 hours with stirring while keeping the reaction mixture at room temperature by cooling and controlling the dropping rate.

LiBr, $AlBr_3$, and other insoluble matter were filtered off, and the formed HBr and the solvent diethyl ether were removed from the filtrate by vacuum distillation, giving liquid $(SiH_2)_5$, yield 75%.

Preparation Example 2

The four-member cyclic compound $[Si(C_6H_5)_2]_4$ was extracted with benzene from 200 parts of X (the abovesaid by-products) using a Soxhlet extractor, and was purified by recrystallization, giving 40 parts of pure $[Si(C_6H_5)_2]_4$. Then, 10 parts of $(SiH_2)_4$ was obtained from this pure $[Si(C_6H_5)_2]_4$ by bromination and reduction in the same manner as in Preparation Example 1.

Preparation Example 3

A mixture of cyclic compounds $[Si(C_6H_5)_2]_n$ ($n \geq 7$) insoluble in THF and in benzene was separated from 1000 parts of X (the above-said by-products). Then, 20 parts of this cyclic compound mixture was added to a dispersion of 10 parts of $AlCl_3$ in 200 parts of benzene which had been placed in advance in a four-necked flask. HCl gas was blown into the mixture with stirring, and the stirring was continued at room temperature up to the complete dissolution of $[Si(C_6H_5)_2]_n$, to replace phenyl thereof by chlorine. The resulting $(SiCl_2)_n$ ($n \geq 7$) was reduced in the same manner as in Preparation Example 1, giving 3 parts of $(SiH_2)_n$ ($n \geq 7$).

The following Example illustrates the process of the invention for producing a-Si deposit films from gaseous cyclic silanes $(SiH_2)_{4\sim6}$ prepared in the above Preparation Examples.

An aluminum cylinder as substrate 2 was set in the deposition chamber 1 of the apparatus shown in the drawing. Gaseous $(SiH_2)_5$ prepared in Preparation Example 1 as a raw material for the formation of silicon deposit films was filled in the gas regulating chamber 14, and sent to the heating chamber 18 with controlling the flow amount by a mass flowmeter through the preheating chamber 17 to be preheated together with a carrier gas, e.g. He or $H_2$, which was supplied from the gas source 15.

If necessary for providing intended characteristics to the product film, other suitable gas (e.g. doping gas) is supplied from the gas source 16 through the preheating chamber 19 to combine with the above gas mixture.

The combined gas was adjusted through a mass flow meter or other means to a prescribed flow rate and charged through the preheating chamber 18 into the deposition chamber 1 under ordinary or slightly elevated pressure. The charged gas was thermally decomposed on contacting with the aluminum cylinder 2, which had been heated through the heat transfer medium 9 heated by the heater 10, whereby the intended a-Si deposit film was formed around the aluminum cylinder 2. In this case; the heat transfer medium 9 was maintained at a prescribed temperature by means of the thermostat 13; the heater 10 was rotated so that the aluminum cylinder would be heated uniformly; and also the aluminum cylinder 2 was rotated by the motor 8 for uniforming the deposit film. The distribution and sizes of the small holes penetrating the walls 4 and 6 had been designed so as to uniform the charge and discharge of gas. The undecomposed gas discharged through the outlet pipe 5 was recycled through the preheating chamber 18 to the deposition chamber 1 by means of the circulating pump 20.

In the same manner as the above, photoconductive films of a-Si were formed around aluminum cylinders by using $SiH_4$, $Si_2H_6$, and $(SiH_2)_4$ and $(SiH_2)_n$ ($n \geq 7$) prepared in Preparation Examples 2 and 3, respectively.

Table 1 shows conditions of film formation and properties of the resulting film with respect to each raw material.

The "image defect" in Table 1 is the irregularity observed in images duplicated in the following manner: Each of the photosensitive drums prepared in this example was set in a copying machine of heat fixing type employing negative-working toners and A-3 size copies of full face dark, full face light, and full face halftone were made by performing positive charging, exposure, and transfer according to the Carlson process.

In each photosensitive drum of this example, a 6000 Å thick barrier layer of a-Si:B:O was formed on the substrate for the purpose of suiting the acceptable potential to the copying process, and the a-Si deposit film was formed on the barrier layer.

TABLE 1

| Raw material gas | $SiH_4$ | $Si_2H_6$ | $(SiH_2)_5$[1] | $(SiH_2)_4$[2] |
|---|---|---|---|---|
| Deposition rate (Å/sec) | —[3] | 3 | 11 | 13 |
| Substrate temp. (°C.) | 450 | 420 | 290 | 260 |
| Gas flow rate[4] (SCCM) | 10–100 | 50 | 50 | 60 |
| Gas pressure in deposition chamber (Torr) | 765–790 | 780 | 770 | 780 |
| Electric conductivity ($\Omega^{-1} cm^{-1}$) | | | | |
| $\sigma_D$ | — | $\sim 10^{-9}$ | $\sim 10^{-10}$ | $\sim 10^{-9}$ |
| $\sigma_P$[5] | — | $\sim 10^{-8}$ | $\sim 10^{-6}$ | $\sim 10^{-5}$ |
| Image defect[6] | — | x | o | o |

Notes
[1]Synthesized in Preparation Example 1
[2]Synthesized in Preparation Example 2
[3]The rate of film formation was very low and the intended film could not be obtained.
[4]Volume (cm³) of gas flowing for 1 minute, reduced to standard state, measured with a mass flow meter.
[5]$\sigma_P$: Measured while irradiating the photosensitive drum with a He-Ne laser beam ($\lambda$ = 6328 Å, 7 mW).
[6]x: The acceptable potential and the sensitivity were low.
o: 2–10 defects (0.5 mm or more in size) were observed in the copy.

What is claimed is:

1. A process for producing silicon-containing deposit films which comprises introducing a cyclic silane represented by the general formula $(SiH_2)_n$, wherein n is 4, 5, or 6, in the gaseous state together with a carrier gas into a deposition chamber and applying heat to the introduced gases at ordinary pressure to decompose the cyclic silane and form a silicon-containing deposit film on a substrate placed in the deposition chamber.

2. The process of claim 1, wherein the silicon-containing deposit film is an amorphous silicon deposit film.

3. The process of claim 1, wherein the cyclic silane is thermally decomposed at temperatures of 100°–350° C.

* * * * *